United States Patent [19]

Herwig et al.

[11] 4,399,239

[45] Aug. 16, 1983

[54] ELASTOMERIC, ETHYLENICALLY UNSATURATED POLYURETHANES AND RADIATION POLYMERIZABLE MIXTURES CONTAINING SUCH POLYURETHANES

[75] Inventors: Walter Herwig, Bad Soden; Kurt Erbes, Flörsheim; Rudolf Decker, Bodenheim; Helga Sikora, Wiesbaden, all of Fed. Rep. of Germany

[73] Assignee: Hoechst Aktiengesellschaft, Frankfurt am Main, Fed. Rep. of Germany

[21] Appl. No.: 400,351

[22] Filed: Jul. 21, 1982

Related U.S. Application Data

[62] Division of Ser. No. 302,687, Sep. 15, 1981.

[30] Foreign Application Priority Data

Sep. 29, 1980 [DE] Fed. Rep. of Germany ....... 3036694

[51] Int. Cl.³ .................... C08G 18/14; C08G 18/32; C08L 29/04; B32B 37/40
[52] U.S. Cl. ............................. 521/137; 204/159.19; 428/425.8; 428/480; 430/284; 524/113; 524/233; 524/361; 525/57; 525/125; 525/127; 528/75
[58] Field of Search ................ 521/137; 524/113, 233, 524/361; 525/57, 125, 127; 528/75

[56] References Cited

U.S. PATENT DOCUMENTS

| | | | |
|---|---|---|---|
| 3,658,531 | 4/1972 | Kurtz | 96/36.3 |
| 3,782,961 | 1/1974 | Takahashi et al. | 96/115 R |
| 3,836,492 | 9/1974 | Watanabe et al. | 260/23 TN |
| 3,850,770 | 11/1974 | Juna et al. | 204/159.19 |
| 3,856,757 | 12/1974 | Satomura | 260/77.5 CR |
| 3,960,572 | 6/1976 | Ibata et al. | 96/115 P |
| 3,966,681 | 6/1976 | Maeda et al. | 260/75 NH |
| 4,128,600 | 12/1978 | Skinner et al. | 528/75 |
| 4,133,723 | 1/1979 | Howard | 528/75 |
| 4,145,509 | 3/1979 | Batia | 528/75 |
| 4,145,513 | 3/1979 | Dalibor | 528/75 |
| 4,153,778 | 5/1979 | Park et al. | 528/75 |
| 4,245,030 | 1/1981 | Faust et al. | 430/281 |
| 4,248,958 | 2/1981 | Faust | 430/288 |
| 4,250,248 | 2/1981 | Faust | 430/284 |
| 4,295,947 | 10/1981 | Ohtani et al. | 204/159.15 |
| 4,334,034 | 6/1982 | Lehner et al. | 525/28 |

FOREIGN PATENT DOCUMENTS

1441108 4/1974 United Kingdom.

Primary Examiner—H. S. Cockeram
Attorney, Agent, or Firm—Schwartz, Jeffery, Schwaab, Mack, Blumenthal & Koch

[57] ABSTRACT

A polyurethane corresponding to the formula:

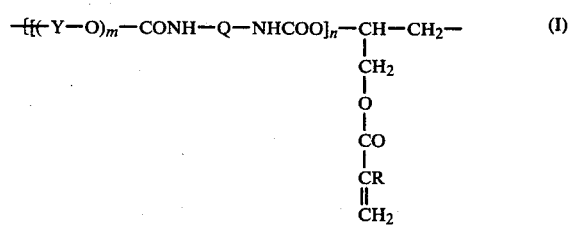

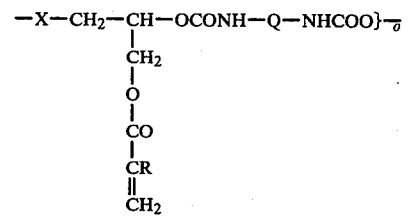

wherein
Q is a divalent, mononuclear or dinuclear aromatic radial which is unsubstituted or is substituted by lower alkyl groups and which can contain, as a linking member, a lower alkylene group,
X is one of the groups —O—Ph—Z—Ph—O— and —OOC—(CH$_2$)$_y$—COO—,
Ph being an optionally substituted phenylene group,
Z being an alkylene group having 1—4 carbon atoms and
y being a number from 2 to 12,
R is a hydrogen atom or a methyl group,
Y is an alkylene radical having 2–6 carbon atoms,
m is an integer from 4 to 50
n is an integer from 1 to 6 and
o is an integer from 4 to 20 having the properties of thermolasts and being hardenable to give elastic products. It is suitable for use as a hardenable constituent of photopolymerizable materials.

19 Claims, No Drawings

ELASTOMERIC, ETHYLENICALLY UNSATURATED POLYURETHANES AND RADIATION POLYMERIZABLE MIXTURES CONTAINING SUCH POLYURETHANES

This is a division of application Ser. No. 302,687, filed Sept. 15, 1981.

BACKGROUND OF THE INVENTION

Polymers in which the elastomeric behavior does not depend on a chemical crosslinking of linear, highly polymeric molecules, but is caused by a physical interaction between specific parts of the molecules, have been widely used in industry for many years. These include, for example, block copolymers in which hard segment regions are embedded in a matrix of elastic segments composed of relatively long-chain blocks. The polymer compositions thus form two incompatible phases which do not separate fully because they are linked via the same polymer chain and their movement is thus restricted. The hard, that is to say rigid, regions thus effect a physical crosslinking and impart an elastomeric behavior to the polymers.

A comprehensive presentation on this subject is found in Thermoplastic Elastomers, Process Economics Program, Stanford Research Inst., Menlo Park, Calif., 1976.

In particular, polyurethanes containing polyether or polyester blocks have acquired importance as elastomers of this type. Thus, French Pat. No. 2,324,666 describes polyether-urethanes which contain units formed from polyether-diols, specific low-molecular weight diols and aromatic diisocyanates. French Pat. No. 2,313,410 described polyether-esters which contain urethane groups and units formed from polyethylene adipate, 1,4-butane diol and aromatic diisocyanates. Polymers to this type are normally no longer susceptible to crosslinking reactions.

A disadvantage of these polymers, termed "Thermolastics", can be seen in the fact that their dimensional stability under a high mechanical loading such as the action of compressive, enlongating or shearing forces, is not comparable to that of classical elastomers, i.e. chemically crosslinked elastomers such as vulcanized poly-isoprene. Many fields of application have therefore been closed to the thermolastics.

Polyurethanes of a similar structure, but having terminal, polymerizable double bonds, are used for producing photopolymerizable recording materials such as printing plates and photoresists. In most cases these polyurethanes are viscous to highly viscous liquids, or soids. They are normally used in admixture with other components.

The essential constituents of such mixtures include a compound which can be polymerized by free radicals and which has terminal, ethylenically unsaturated groups; a binder, and an initiator which can be activated by radiation.

Polymerizable mixtures of this type are, e.g., disclosed in U.S. Pat. Nos. 2,760,863; 3,060,023 and 3,149,975. The polymerizable, ethylenically unsaturated compounds described in these texts are low-molecular weight and high-molecular weight compounds having terminal or side chain vinyl or vinylidene groups, particularly acrylic and methacrylic acid esters of low-molecular weight or high-molecular weight polyhydroxy compounds. In practice, polymerizable compounds which have hitherto gained acceptance are almost exclusively photopolymerizable materials based on such esters. Of these compounds, it is particularly the low-molecular weight compounds which have been preferentially employed in industry.

Such mixtures are used in reproduction technology for producing printing plates, photoresists (i.e. etch resists and electro-plating resists) and relief images which may be colored.

A particular group of mixtures of this type suitable for producing photoresists, is used in the form of a dry, photopolymerizable layer on a temporary support formed from a transparent, flexible plastic film. The layer is laminated under pressure and heat to a metal carrier such as a copper plate, which is to be modified image-wise; the layer is exposed while on the plate and developed to give a photoresist. Such materials and methods of processing are described in German Auslegeschrift No. 1,522,515 and German Offenlegungschrift No. 2,064,079.

The polymerizable compounds used in such mixtures are generally compounds which contain urethane groups and have terminal acrylic or methacrylic acid ester groups and which can also contain oligo-ether units. Mixtures which contain such oligomeric, polymerizable compounds and which generally exhibit particularly good flexibility are described, e.g, in German Offenlegungsschriften Nos. 2,822,189; 2,822,190 and 2,822,191, in German Auslegeschrift No. 2,115,373 and in U.S. Pat. Nos. 3,850,770 and 3,960,572.

Oligo-urethane compounds of this type also have been disclosed for producing synthetic elastomers having desirable properties, as described in British Pat. No. 1,441,108.

SUMMARY OF THE INVENTION

Accordingly, it is an object of the present invention to provide now thermoelastic polyurethanes.

A further object of the present invention is to provide a thermolastic polyurethane which can be converted into products which have increased elastomeric character.

It is also an object of the present invention to provide a crosslinkable thermolastic polyurethane.

Another object of the present invention is to provide a polyurethane which can be combined with low-molecular weight acrylic acid and methacrylic acid esters and polymeric binders to give homogeneous mixtures.

An additional object of the present invention is to provide a polyurethane which is particularly suitable for producing photopolymerizable mixtures.

These and other objects of the invention are achieved by providing a polyurethane corresponding to the formula:

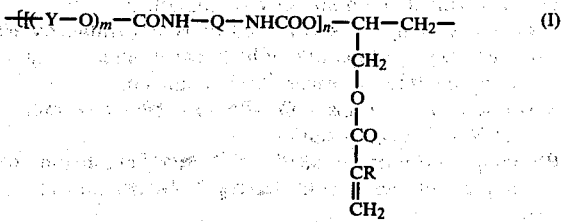

-continued

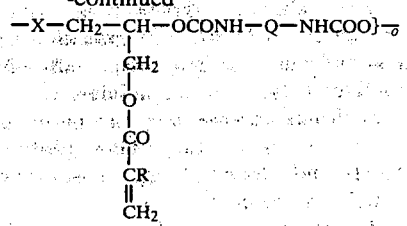

wherein
Q is a divalent, mononuclear or dinuclear aromatic radical which is unsubstituted or is substituted by lower alkyl groups and which can contain, as a linking member, a lower alkylene group,
X is one of the groups —O—Ph—Z—Ph—O— and —OOC—$(CH_2)_y$—COO—,
Ph being an optionally substituted phenylene group
Z being an alkylene group having 1–4 carbon atoms and
y being a number from 2 to 12,
R is a hydrogen atom or a methyl group,
Y is an alkylene radical having 2–6, preferably 2–4, carbon atoms
m is an integer from 4 to 50,
n is an integer from 1 to 6 and
o is an integer from 4 to 20.

The objects of the invention are also achieved by providing a radiation polymerizable mixture comprising
a polymeric binder,
a radiation activatable polymerization initiator, and
a polymerizable acrylic or methacrylic acid ester corresponding to the formula:

(I)

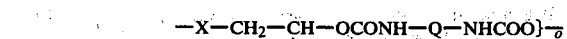

wherein
Q is a divalent, mononuclear or dinuclear aromatic radical which is unsubstituted or is substituted by lower alkyl groups and which can contain, as a linking member, a lower alkylene group,
X is one of the groups —O—Ph—Z—Ph—O— and —OOC—$(CH_2)_y$—COO—,
Ph being an optionally substituted phenylene group
Z being an alkylene group having 1–4 carbon atoms and
y being a number from 2 to 12

R is a hydrogen atom or a methyl group
Y is an alkylene radical having 2–6, preferably 2–4, carbon atoms
m is an integer from 4 to 50
n is an integer from 1 to 6 and
o is an integer from 4 to 20.

The new polyether-ester-urethanes are elastomeric linear polymers which can be utilized in a variety of ways both as industrial plastics and also as constituents of photopolymerizable reproduction materials. They have the properties of thermoplasts, but can be crosslinked via the acrylic or methacrylic acid ester groups contained in them to give materials having new, valuable properties. They can, for example, be used in the production of automobile tires. They are soluble in numerous organic solvents and miscible within wide ratios with many low-molecular weight, difunctional and polyfunctional acrylic and methacrylic acid esters. They also form homogeneous phases with numerous polymeric binders and are thus particularly suitable for the production of homogeneous, light-sensitive negative-acting layers.

It is surprising that these elastic, polymeric urethanes, which by themselves cannot be dispersed in aqueous alkalis, produce, in combination with specific acrylates and polymeric binders, layers which can be developed using purely aqueous, solvent-free or substantially solvent-free developers.

The high elasticity and flexibility of the polymeric urethanes also makes it possible to produce layers which are distinguished, even in the exposed state, by good toughness and resistance to abrasion, a property which is highly useful in dry and liquid resists, in dry and liquid solder-stop masks and in printing plates. A further advantage is that the rheological behavior of such layers is particularly adaptable to special technological requirements. For example, in the case of a dry resist which has been processed into rolls, it is possible to virtually suppress, even under warm storage conditions, the adhesion of the margins adjacent the cut edges which causes so much difficulty.

DETAILED DESCRIPTION OF PREFERRED EMBODIMENTS

The preparation of these polyether-ester-urethanes having ethylenically unsaturated side groups is effected in a known manner by reacting oligomeric diisocyanates with specific hydroxyalkyl acrylates or methacrylates.

The starting components are as follows:

A. Fluid to viscous, oligomeric, linear ether-urethanes containing isocyanate end groups corresponding to the formula:

(II)

wherein the symbols Q, m, n and Y have the meaning indicated above. These oligomeric, commercially available ether-urethanes are prepared in accordance with known processes by reacting polyether diols with a molar excess of aromatic diisocyanate. This gives a mixture of homologous oligomers containing isocyanate end groups. Resins having a viscous consistency are obtained if the molar excess in this reaction is selected so that the average value of n is from 1 to 4.

B. Bis-acrylic acid ester-diols corresponding to the formula:

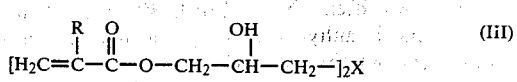

wherein X and R have the meaning indicated above.

The elastic polyurethanes according to the invention are obtained by polyaddition of the components A and B.

The properties of the polymers can be varied and, above all their elastomeric character can be considerably improved by intermolecular polymerization of the acrylate groups.

The polyaddition reactions are carried out by known techniques. The reactions can be carried out in non-polar and polar solvents, for example in toluene, acetone, methyl ethyl ketone or tetrahydrofuran. The reaction can be accelerated by heating the reaction medium. It is also desirable to use a catalyst, for example tin-II laurate, or a metal chelate such as iron trisacetyl-acetonate. After the polyaddition reaction has been carried out, the polymers can be isolated by removing the solvent, for example by distillation or freeze-drying. If desired they can also be precipitated by stirring the reaction mixture into other liquid media, for example methanol and filtered out. The polyaddition reactions can also be carried out in the absence of a solvent, by intimately mixing the components, with catalyst if desired, in suitable mixers such as cam kneaders, and also heating if desired.

Linear, non-crosslinked polyurethanes which still contain the acrylate groups mentioned above, are obtained in all cases. These polymers possess elastomeric properties. They are thermoplastic and can be shaped by customary industrial processes to form articles such as drive belts, shoe soles, sealing washers, films, and fibers.

The improvement in the physical properties by crosslinking the polyurethanes according to the invention can be carried out industrially in various ways. For example, after adding a peroxide catalyst, the polyurethanes can be directly crosslinked in solution by increasing the temperature. It is possible in this way to prepare optically clear, highly elastic, dimensionally stable substances which contain solvent and which can be used, for example, for fabricating lenses, lens systems and comfortable mattresses. Surface hardening of these substances is possible by merely heating for a brief period under a slightly reduced pressure. This produces a thin, solvent-free surface which produces a certain mechanical strength and at the same time acts as a vapor barrier for the solvent-containing core.

If, in addition to the catalyst for the acrylate polymerization, these polymer solutions also contain nucleating agents, it is possible during the removal of the solvent in vacuo and at elevated temperature to prepare open and closed cell foams, having small and coarse pores. An additional blowing agent is generally unnecessary, since this function is performed by the evaporating solvent.

The process can also be constructed by comminuting the highly crosslinked rubber, for example in a beater mill, after the crosslinking reaction in solution and after the reaction medium has been completely removed, and then molding the rubber by the compression-molding process at elevated temperature, if appropriate with the addition of suitable fillers, such as carbon black, wood flour, glass powder, calcium carbonate or other thermoplastic resins, to give desired industrial components.

However, it is also possible to choose the acrylate-crosslinking catalyst in such a way that no crosslinking takes place either before or during removal of the solvent whether by means of a vacuum or precipitation and only the finished molding is subjected to a final crosslinking stage, by suitable heat treatment. It is also possible in this process, if desired, to incorporate suitable auxiliary substances and fillers into the polyurethanes.

Finally, in many cases it may be advantageous not to add the crosslinking catalyst to the linear polyurethane whether isolated from solution or prepared in solvent-free form until shortly before the final formulation. It is, of course, also possible in special cases to crosslink the reactive, linear polyurethanes autocatalytically by means of an accelerated heat treatment.

The polymers of the invention can also be mixed with natural or synthetic rubbers or thermoplastics having different chemical structures and processed therewith to give materials which are industrially useful. The degree of crosslinking of the elastomeric polyurethane can, if desired, also be controlled by partially replacing bis-acrylate ester component with simple diols, thereby reducing the concentration of acrylate groups in the none-crosslinked, linear polyurethane.

In every case the invention makes it possible to prepare polyurethanes having excellent elastomeric character and particularly good viscous elastic behavior when subjected to permanent or periodic deformation by pressure. Such materials are needed, for example, in gaskets, in damping members in mechanical engineering and in floor coverings.

Depending on the application, the molecular weights of the polyurethanes of the invention can vary within wide ranges. In general, useful products are obtained if the reduced specific viscosities (RSV), measured with 1% strength solutions in dimethylformamide at 25° C., are from about 0.15 to 1.4 dl/g. Products having RSV values within the range of 0.2 to 0.9 dl/g are preferred. Preferred average values of m are 8 to 20, of n are 2 to 4, of o are 5 to 12 and of y are 2 to 6.

Q is a mononuclear or dinuclear arylene group which generally has 6 to 20 carbon atoms. The aromatic nuclei may bear lower alkyl group substituents having from 1 to about 4 carbon atoms. If two aromatic nuclei are present, they may be condensed with each other or linked by means of a singel bond or via an alkylene group having 1 to 4 carbon atoms. The following are examples of suitable arylene groups: phenylene, tolylene, xylylene, naphthylene, diphenylene and methyl-substituted and ethyl-substituted diphenylene groups, and diphenylmethane and 2,2-diphenylpropane groups having free valencies in the 2-, 3-, or 4-position of both nuclei, preferably in the 4,4'-positions.

Y is a linear or branched alkylene group. Preferred examples include ethylene, 1,2-propylene and 1,4-butylene groups.

Z represents an alkylene group. Preferably the free valencies are both present at the same carbon atom. Particularly preferred groups include methylene groups, 1,1-ethylene groups and 2,2-propylene groups.

The phenylene groups attached to Z can be substituted, for example, by alkyl groups having 1–4 C atoms, alkoxy groups having 1–4 C atoms or halogen atoms. Due to their ready availability, compounds having unsubstituted phenylene groups are preferred. R is preferably a methyl group.

The unsaturated polyurethanes of the invention can be used for producing elastic moldings. They are also useful as photoreactive compounds in photopolymerizable mixtures or mixtures which can be polymerized by radiation. In this case, they are employed in admixture with an initiator which can be activated by radiation, particularly by light, and, if desired, with a polymeric binder, generally a saturated binder, and optionally with low molecular weight monomers. The higher-molecular weight representatives are also useful, without the addition of polymeric binders, for producing highly flexible light-sensitive layers. The low molecular weight representatives are preferably employed in combination with binders. In order to improve the light sensitivity and, in some cases, the ability to develop the layer with aqueous solutions, it is advantageous in most cases to combine the urethanes of the invention with different low-molecular weight acrylic or methacrylic acid esters as polymerizable compounds.

In general, the polymerizable mixture contains from 20 to 100, preferably 30 to 60, % by weight of polymerizable or crosslinkable compounds and from 0 to 80, preferably 40 to 70, % by weight of binders. In turn, from 5 to 100, preferably 10 to 60, % by weight of the polymerizable compounds can consist of urethanes according to the invention.

Suitable low-molecular weight acrylic or methacrylic acid esters include the esters of these acids with dihydric or polyhydric alcohols such as ethylene glycol, diethylene glycol, triethylene glycol, polyethylene glycols having molecular weights of 200 to 1,000, 1,4-butane diol, neopentylglycol, trimethylolethane, trimethylolpropane, 1,3-butane diol and bisphenol A-bis-hydroxyethyl ether. Urethane group containing low-molecular weight bis-acrylates and bis-methacrylates obtained by reacting 2 moles of a hydroxyalkyl acrylate or methacrylate with 1 mole of an aliphatic or cycloaliphatic diisocyanate such as 2,2,4-trimethylhexamethylene diisocyanate, are also useful.

The mixtures of the invention may also contain polymeric binders. A large number of soluble organic polymers are suitable for this purpose, including: polyamides, polyvinyl esters, polyvinyl acetals, polyvinyl ethers, polyacrylic acid esters, polymethacrylic acid esters, polyesters, alkyd resins, polyacrylamide, polyvinyl alcohol, polyethylene oxide, polydimethylacrylamide, polyvinyl-pyrrolidone, polyvinylmethylformamide, polyvinylmethyl-acetamide and copolymers of the monomers which form the listed homopolymers.

Other suitable binders include natural materials or modified natural materials such as gelatine or cellulose ethers.

It is desirable to use binders which are soluble or at least can be swelled in aqueous alkaline solutions, since layers containing such binders can be developed with the preferred aqueous alkaline developers. Binders of this type may contain the following groups: —COOH, —PO$_3$H$_2$, —SO$_3$H, —SO$_2$NH$_2$ and —SO$_2$—NH—CO—. Suitable soluble or swellable binders include maleate resins, polymers formed from N-(p-tolylsulfonyl)-carbamic acid β-methacryloyloxyethyl esters and copolymers of these and similar monomers with other monomers, styrene/maleic anhydride copolymers and methyl methacrylate/methacrylic acid copolymers.

Copolymers which are particularly advantageous are those formed from methacrylic acid, alkyl methacrylates and methyl methacrylate and/or styrene, acrylonitrile and other substances as described in German Offenlegungsschriften Nos. 2,064,080 and 2,363,806. Styrene/maleic anhydride or styrene/maleic acid ester copolymers can also be used.

A large number of substances can be used as photoinitiators in the mixtures of the invention. Examples include benzoin; alkylbenzoins; benzoin ethers; polynuclear quinones such as 2-ethylanthraquinone; acridine derivatives such as 9-phenyl acridine, 9-p-methoxyphenyl acridine, 9-acetylamino acridine or benz(a)acridine: phenazine derivatives such as 9,10-dimethylbenz(a)-phenazine, 9-methylbenz(a)phenazine or 10-methoxybenz(a)phenazine; quinoxaline derivatives such as 6,4',4''-trimethoxy-2,3-diphenyl quinoxaline or 4',4''-dimethoxy-2,3-diphenyl-5-aza quinoxaline; or quinazoline derivatives.

Besides monomers, binders and photoinitiators, the inventive mixtures may also contain customary additives such as inhibitors for preventing thermal polymerization of the monomers, hydrogen donors, sensitometric regulators, dyestuffs, colored pigments, non-colored pigments, color precursors, indicators and plasticizers. Desirably, such additives will be selected so that, insofar as possible, they do not exhibit strong absorption in the actinic range of wave-lengths which is important for the initiation process.

As used herein "actinic radiation" means any radiation which has an energy corresponding at least to that of short-wave, visible light. Long-wave UV radiation is particularly suitable, but electron radiation, X-ray radiation and laser radiation are also useful.

The photopolymerizable mixture of the invention can be marketed in a known manner in solution in solvents or solvent mixtures. Such mixtures can be used for producing electro-plating resists, etch resists, special stencils for screen printing and solder-stop masks. The mixtures of the invention can also be used for producing dry resist films. These are composed of a finished photoresist layer which is present on a temporary support such as a transparent plastic film. The photo-resist layer is laminated by the consumer to the support which is to be etched or electro-plated imagewise, and is exposed and developed thereon. The temporary support is removed before development. The mixtures of the invention are particularly suitable for such applications. The mixtures of the invention can also be used for factory scale production of a presensitized copying material on a suitable support, for example on aluminum or zinc, for the photomechanical production of offset or letterpress forms such as flexographic printing forms. They are also suitable for producing relief images, screen printing stencils, color-proofing films and the like. Their advantages become apparent in all cases where good and permanent flexibility and elasticity of the exposed layer together with low cold flow of the unexposed layer are required as well as high resistance of the exposed layer to corrosive chemicals.

Light-sensitive materials are produced in a known manner using mixtures of the invention. The mixture can be taken up in a solvent and the solution or dispersion can be applied to the intended support in the form of a film by casting, spraying, dipping or roller application and the like, and can then be dried. Thick layers (for example layers having a thickness of 250 μm or more) can also be extruded or compressed to form a self-supporting film which is then laminated to the support.

Suitable supports for copying layers made from the mixtures of the invention include metals such as aluminum, zinc, copper, steel, chromium, brass and other metal alloys; screen printing stencil supports, such as those made of nickel or Perlon gauze; and plastic films such as polyester films. If plastic films are used, they may be given face treatment.

The copying layers are exposed and developed in a known manner. Suitable developers are aqueous solutions, preferably aqueous alkaline solutions, for example solutions of alkali metal phosphates, carbonates or silicates, to which small quantities up to 10% by weight of water-miscible organic solvents or wetting agents can be added if desired. Layers in which the proportion of polymerizable compounds consists solely or primarily of the new polyurethanes require a fairly high proportion of organic solvent or even pure organic solvent for development. However, in most cases it is not necessary to use the polyurethanes as the sole polymerizable compounds, since, as explained above, even in small proportions they impart their advantageous properties to the light-sensitive layer. Development can be effected by hand or in commercially available spray or brush developing machines.

As mentioned above, the mixtures of the invention can be used for a wide variety of applications. They are particularly useful for producing photoresist layers or each resists on metallic supports. They are especially suitable for application to copper supports. The excellent adhesion and flexibility of the exposed portions of the layer becomes apparent in these preferred embodiments not only during development, but also in the subsequent etching of the support, during which the layers exhibit good flexibility and resistance to etching.

The mixtures of the invention are particularly suitable for use as so-called dry resist materials, as described above, since they can be transferred in a dry state onto metal supports to form well-adhering layers. In this case, films such as polyester films may be used as temporary supporting films.

The following examples illustrate individual embodiments of mixtures according to the invention. Unless otherwise specified, percentages and proportions are calculated on a weight basis. Parts by weight and parts by volume are related as g to ml.

EXAMPLE 1

A solution was prepared from:
6.5 parts by weight of a terpolymer formed from n-hexyl methacrylate, methacrylic acid and styrene (60:30:10) having an average molecular weight of approximately 35,000 and an acid number of 195,
3.2 parts by weight of polyethylene glycol-400-dimethacrylate,
0.8 part by weight of the elastomer described below,
0.1 part by weight of 9-phenyl acridine,
0.035 part by weight of an azo dyestuff obtained by coupling a 2,4-dinitro-6-chlorobenzenediazonium salt with 2-methoxy-5-acetylamino-N-cyanoethyl-N-hydroxy-ethylaniline,
2.5 parts by weight of methyl ethyl ketone and
3 parts by weight of ethanol.

The elastomer used was prepared as follows:

A. 426 parts by weight of glycidyl methacrylate and 216 parts by weight of adipic acid were mixed by stirring in a 1 liter four-necked flask, equipped with a stirrer, a thermometer, a reflux condenser and a drying tube, and, after adding 19.7 parts by weight of p-methoxyphenol and 6.4 parts by weight of benzyl triethylammonium chloride, the mixture was heated cautiously to an internal temperature of 80° C. After approximately 2 hours, a clear solution was obtained which was kept at 80° C. for a further 14 hours. After this time, the content of free glycidyl methacrylate was less than 0.5%.

B. 143 parts by weight of an oligomeric diisocyanate corresponding to the formula (II) indicated above, wherein Q is tolylene and Y is 1,4-butylene, having an average molecular weight of about 2,000 and an isocyanate group content of 4.1% by weight, (Adiprene L 100), dissolved in 300 parts by volume of methyl ethyl ketone, were placed in a 1 liter four-necked flask equipped with a stirrer, a thermometer, a dropping funnel, a condenser and a drying tube, and 0.87 part by weight of benzoquinone and 0.85 part by volume of a solution prepared by dissolving 6.3 parts by weight of iron-III acetylacetonate and 0.45 part by weight of triethylamine in methyl ethyl ketone and making up to 100 parts by volume with methyl ethyl ketone, were added. A solution of 31.33 parts by weight of the reaction product obtained according to the proceedure of Example IA in 300 parts by volume of methyl ethyl ketone was introduced into the dropping funnel and was added dropwise, over a period of 40 minutes, to the solution in the flask, which had been heated to 70° C. and was stirred. After stirring for a further two hours at 30° C. 10 parts by volume of ethanol were added to the clear reaction mixture. Distilling off the solvent from the viscous solution gave a non-adhesive, rubberlike mass, which gave a clear solution, in tetrahydrofuran, acetone or toluene. The reducer specific viscosity of the product was 0.72 dl/g (measured with a 1% solution in dimethylformamide at 25° C).

A solvent solution of the product was applied by spin-coating onto a biaxially stretched and thermofixed polyethylene terephthalate film 25 μm thick in such a way that a film weight of 45 g/m² was obtained after drying at 100° C.

The resulting dry resist film was laminated at 120° C., using a commercially available laminating device, to a phenoplast laminated sheet backed with a copper foil 35 μm thick, and was exposed for 4 seconds using a commercially available exposure apparatus (output 5 kW). The image used was a line original which had line widths and intervals down to 60 μm.

After exposure, the polyester film was stripped off and the layer was developed for 60 seconds in a 0.8% sodium carbonate solution in a spray processor.

The sheet was rinsed with tap water for 30 seconds, subjected to incipient etching for 30 seconds in a 15% solution of ammonium peroxydisulfate and then successively electro-plated in the following electrolyte baths:

1. 40 minutes in a type "Glanzkupfer-Bad" copper electrolyte bath made by Schloetter, Geislingen/Steige:
   current density 2.5 A/dm²
   metal build-up approximately 20 μm.
2. 10 minutes in a type "Norma" nickel bath made by Schloetter, Geislingen/Steige:
   current density 5 A/dm²
   metal build-up 10 μm.
3. 10 minutes in a type "Autronex CC" gold bath made by Blasberg, Solingen:
   current density 1.0 A/dm²
   metal build-up 2.0 μm.

The electrolyte pattern produced on the sheet exhibited no sub-layer phenomena or damage at any point. This sheet could be stripped in a 5% strength KOH solution at approximately 40°-50° C. The copper exposed in this way can be removed by etching in customary etching agents.

This example was carried out in commercial scale as follows:

A polyester film web 110 cm wide was continuously coated with a solution of the above-described composition using a slot die. After passing through a drying zone, the resist layer had a thickness of 38 μm. It was then covered with a polypropylene film. The resulting dry resist film was stored on a large roll. The larger roll was then cut in a roll cutter into manageable resist rolls having a width of 45 cm and a web length of 50 m. An optimum winding tension was maintained in order to ensure that the roll was built up uniformly, layer for layer, over the supporting core and did not slip laterally, i.e., did not telescope. Rolls produced in this way were stored in a drying cabinet at 40° C.

Even after storage times of more than 12 weeks, the cut edges of the rolls were unchanged and were completely free from emergence of resist which would lead to sticking. This dry resist could be processed in the same manner as above.

The dry resist described above was very elastic and flexible, even after 10-fold overexposure, i.e., after 40 seconds exposure in the afore-described exposure apparatus. An exposed resist strip can, for example, be bent through 180° several times at room temperature without the bent area tearing. The resist can be elongated by a factor of 3 to 4 by stretching. This behavior is important, for example, when manually retouching finished printed circuit boards. Flexible resists are also required for the manufacture of through-hole plated circuits ("Tenting process").

The layers described make it possible to resolve, with sharp outlines, lines of a width of 80 μm; the resist flanks stand upright on the base copper. This behavior was demonstrated by exposure using an appropriate resolving test original and subsequently developing with 0.8% strength sodium carbonate solution. The developer resistance was than at least five times the development time.

EXAMPLE 2

The urethane solution described in Example 1 was spin-coated onto a phenoplast laminated sheet having a backing of copper foil 35 μm thick to obtain a coating having a dry weight of 37–38 g/m². The sheet was then dried for 3 minutes at 100° C. in a circulating air drying cabinet. The resulting sheet was treated further exactly as described in Example 1, except a line original was used having line widths and intervals down to 5 μm. The plate was exposed without a PET intermediate film directly through a line original, which acted as an exposure mask, conductive pathways were resolved, with sharp outlines, down to a width of 25 μm.

EXAMPLE 3

The procedure of Example 1 was followed, using 0.7 part by weight of the product described in the following text instead of the elastomer used in Example 1:

177 parts by weight of the diisocyanate described in Example 1B in 250 parts by volume of methyl ethyl ketone were initially placed in a 1 liter three-necked flask, equipped with a thermometer, a dropping funnel, a condenser, a drying tube and a magnetic stirrer, and 1 part by weight of 1,4-benzoquinone, 0.05 part by weight of iron-III actylacetonate and 2 parts by volume of a 1% strength solution of triethylamine in methyl ethyl ketone were added.

After this solution had been heated to 60° C., a solution of 45.3 parts by weight commercial 2,2-bis-[4-(2-hydroxy-3-methacryloyloxypropoxy)-phenyl]-propane, (C theoretical: 67.97%; C found: 67.9%; H theoretical: 7.03; H found: 7.1%; OH number theoretical: 219; OH number found: 216; Br number theoretical: 62.5; Br number found: 65) in 150 parts by volume of methyl ethyl ketone was added dropwise to the solution over a period of 30 minutes, and the reaction product was kept at 65–70° C. for 2 hours; 5 parts by volume of alcohol were then added. Distilling off the solvent gave a dry, elastic rubber, soluble in methyl ethyl ketone, toluene and/or tetrahydrofuran. The product had a reduced specified viscosity of 0.68 dl/g (measured with a 1% solution in dimethylformamide at 25° C).

A dry resist film was prepared as described in Example 1 and was laminated, exposed and developed. Neither in these stages nor in the subsequent electroplating operations, were there substantial differences from the results of Example 1.

The adhesion to copper of the freshly laminated but unexposed resist was particularly noteworthy. This adhesion was tested in analogy with a "cross-hatch cut test for paints and similar coatings" as specified in DIN 53,151. Six longitudinal and six transverse cuts were made with a razor blade in a resist sample, so that 25 squares were formed on an area of about 1 cm². A piece of pressure-sensitive adhesive strip 12 mm wide was adhered onto this area diagonally over the slit pattern. The film was then stripped off at an angle of 90°. Only 30 seconds after lamination, the test material showed no separations.

EXAMPLES 4 TO 7

The following table summarizes four examples which do not differ from Examples 1 and 2 in the proceedure followed, but utilize different formulations.

| Example | Binder | Quantity | Acrylate monomer | Quantity | 9-Phenyl acridine | Dyestuff of Example 1 | Properties and remarks |
|---|---|---|---|---|---|---|---|
| 4 | Terpolymer formed from butyl methacrylate/ methacrylic acid/ styrene (66.7:20*11.3), Acid no. 122–125 | 6.5 | PEG-400 dimethacrylate Elastomer from Example 1 | 3.0 0.6 | 0.1 | 0.035 | slightly tacky layer, particularly good adhesion to metal. Good gold bath stability in gold baths at a low current efficiency |
| 5 | as Example 1 | 6.5 | Bis-urethane dimethacrylate* Elastomer from Example 1 | 5.0 0.6 | 0.1 | 0.035 | Particularly suitable for lead-tin electroplating |
| 6 | Copolymer formed | 6.0 | Elastomer | 4.0 | 0.2 | 0.025 | Developed with |

-continued

| Example | Binder | Acrylate Quantity | monomer | Quantity | 9-Phenyl acridine | Dyestuff of Example 1 | Properties and remarks |
|---|---|---|---|---|---|---|---|
| 7 | from vinyl acetate/crotonic acid (90:10) Acid no. 70 Terpolymer formed from butyl methacrylate/methyl methacrylate/methacrylic acid (45:35:20) Acid no. 157 | 6.5 | from Example 1 as Example 4 | 3.0 0.6 | 0.1 | 0.035 | trichloroethane Developed with a 3% strength aqueous solution of $Na_2SiO_3.9H_2O$ |

*prepared from 1 mole of trimethylhexamethylene diisocyanate and 2 moles of β-hydroxyethyl methacrylate The resulting variations in the properties of the resists are reported in the table by means of keywords. Amounts are stated in parts by weight.

EXAMPLE 8

Ten parts by weight of the elastomer described in Example 1 were dissolved in 35 parts by volume of methyl ethyl ketone together with 0.18 part by weight of 9-phenyl acridine and 0.02 part by weight of a red azo dyestuff corresponding to the formula:

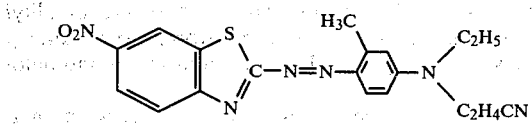

This solution was spin-coated onto a polyester film 23 μm thick to produce a film having a weight of approximately 50 g/m² after drying at 100° C. This dry resist film was laminated at 120° C., using a commercially available laminating device, to a phenoplast laminated sheet which was backed with a copper foil 35 μm thick. After exposure for 90 seconds through a mask carrying a conductive pattern, using a 5 kW exposure apparatus, the polyester film was stripped off and the layer was developed with the aid of a cottonwood pad impregnated with 1,1,1-trichloroethane. The exposed metal layer was electroplated and finished in conventional fashion (compare Example 1). After electroplating, the resist layer which had been crosslinked by light could be removed with aqueous alkali solution, and the copper which was uncovered could be removed by etching in customary etching media.

EXAMPLE 9

A sufficient quantity of the coating solution described in Example 1 was spin coated onto a polyester film on a rotating plate to produce a resist layer 50–100 μm thick after drying at 100° C. The resist was laminated at 120° C., using a commercially available laminator, to a phenolic resin or epoxide printed circuit board equipped with a printed circuit. The layer was then exposed through a mask which covered the points to be soldered using a commercially available exposure apparatus containing a 5 kW MH lamp, and developed for 2 minutes in a commercially available spray processor using 0.8% strength sodium carbonate solution. The material was blown dry and exposed for a further 40 seconds in order to achieve subsequent hardening. Printed circuit boards pretreated in this way were soldered in a commercially available immersion soldering bath, filled with a eutectic Sn/Pb mixture (63 Sn/37 Pb). Before soldering, the prepared board was wetted with a solution of colophony in isopropanol. The immersion time in the soldering bath, heated to 250° C., was 10 seconds. The resist-free areas to be soldered exhibited a satisfactory build-up of solder. The hardened resist layer was substantially unaffected by the heat to which it was exposed in the soldering operation.

EXAMPLE 10

A dry resist film was prepared as in Example 8, but 8 parts by weight of elastomer and 2 parts by weight of polyethylene glycol-400-diacrylate were used instead of 10 parts by weight of the elastomer. Processing was carried out as described in Example 8, except that the exposure time was 8 seconds. Similarly good results were obtained.

EXAMPLE 11

An elastomeric polyurethane was prepared as described in Example 1, but the p-methoxy phenol was omitted from reaction stage A and the 1,4-benzoquinone was omitted from reaction stage B. A solution of 0.1 part by weight of azodiisobutyronitrile in 50 parts by volume of methyl ethyl ketone was added rapidly, while stirring, to the viscous solution, and the mixture was poured into a beaker lined with aluminum foil. A clear, elastomeric, dimensionally stable mass, which was self-supporting after the removal of the beaker and the metal foil, was obtained after 4–6 hours at a temperature of 50° C.

Elastomeric pieces exhibiting high resilience were formed by cutting up the mass into pieces the size of hazelnuts and drying the pieces in vacuo.

EXAMPLE 12

Disc-shaped bodies having a diameter of 29 millimeters and a height of 12 millimeters were cut from solvent-free masses of the elastomers described in Examples 1 and 11. Using the test apparatus described in DIN 53,517, the residual compressive set DV of the two masses were determined according to the formula:

$$DV = \frac{h_o - h_2}{h_o - h_1} \cdot 100$$

($h_o$ is original height of the test specimen in millimeters, $h_1$ is the height of the test specimen in the compressed state in millimeters and $h_2$ is the height of the test specimen after release in millimeters). The values of $h_2$ were determined after the test specimens had been kept in the compressed state for the time indicated and at the temperature indicated.

| | 24 hours 20° C. | 80 hours 20° C. | 24 hours 70° C. | 80 hours 70° C. |
|---|---|---|---|---|
| Residual molding | 20–30 | 35–60 | 70 | 80 |

|  | | 24 hours 20° C. | 80 hours 20° C. | 24 hours 70° C. | 80 hours 70° C. |
|---|---|---|---|---|---|
| compressive set (DV) in % | according to Example 1 molding according to Example 11 | 5 | 7 | 8-10 | 12-15 |

EXAMPLE 13

Using a wooden spoon 4.4 parts by weight of the reaction product described in Example IA were intimately mixed in a beaker with 21.0 parts by weight of the oligomeric diisocyanate described in Example IB, after adding a pinch of azodiisobutyronitrile, and the beaker was placed in a warming cabinet at 80° C. In the course of 5 hours, a fine-pored, extremely elastic foam plug was formed, which could be trimmed into any desired shape.

The foregoing embodiments have been set forth merely as illustrative examples of the invention and are not intended to be limiting. Since modifications of the disclosed embodiments incorporating the spirit and substance of the invention may occur to persons skilled in the art, the scope of the invention is to be limited solely with respect to the appended claims and equivalents.

What is claimed is:

1. A polyurethane corresponding to the formula:

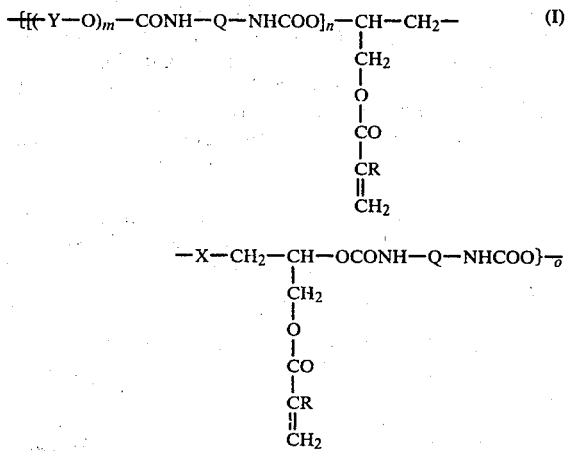

wherein

Q is a divalent, mononuclear or dinuclear aromatic radical which is unsubstituted or is substituted by lower alkyl groups and which can contain, as a linking member, a lower alkylene group, X is one of the groups —O—Ph—Z—Ph—O— and —OOC—(CH$_2$)$_y$—COO—, Ph being an optionally substituted phenylene group, Z being an alkylene group having 1-4 carbons atoms, and y being an integer from 2 to 12, R is a hydrogen atom or a methyl group, Y is an alkylene radical having 2-6 carbon atoms, m is an integer from 4 to 50, n is an integer from 1 to 6, and o is an integer from 4 to 20.

2. A polyurethane according to claim 1, wherein Q represents an aromatic radical selected from the group consisting of phenylene, tolylene, xylylene, naphthylene, diphenylene, methyl-substituted diphenylene, ethyl-substituted diphenylene, and diphenylmethane and 2,2-diphenylpropane groups having free valencies in the 2-, 3- or 4-position of both nuclei.

3. A polyurethane according to claim 1, wherein Q represents a tolylene radical.

4. A polyurethane according to claim 1, wherein Y represents an alkylene radical selected from the group consisting of ethylene; 1,2-propylene; and 1,4-butylene.

5. A polyurethane according to claim 1, wherein X represents a radical corresponding to the formula

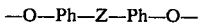

Ph represents an optionally-substituted phenylene radical and Z represents an alkylene radical in which the free valencies are both at the same carbon atom.

6. A polyurethane according to claim 5, wherein Ph represents a phenylene radical bearing at least one substituent selected from the group consisting of alkyl groups containing from 1 to 4 carbon atoms, alkoxy groups containing from 1 to 4 carbons atoms and halogen.

7. A polyurethane according to claim 5, wherein Z represents an alkylene radical selected from the group consisting of methylene and 2,2-propylene.

8. A polyurethane according to claim 1, wherein X represents a radical corresponding to the formula:

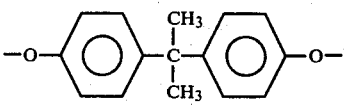

9. A polyurethane according to claim 1, wherein X represents a radical corresponding to the formula:

and y represents an integer from 2 to 6.

10. A polyurethane according to claim 9, wherein X represents a radical corresponding to the formula:

11. A polyurethane according to claim 1, wherein R represents a methyl radical.

12. A polyurethane according to claim 1, wherein m represents an integer from 8 to 20; n represents an integer from 2 to 4; and o represents an integer from 5 to 12.

13. A polyurethane according to claim 1, wherein Q represents a tolylene group; Ph represents an unsubstituted phenylene group; Z represents an alkylene radical selected from the group consisting of methylene and 2,2-propylene; y represents an integer from 2 to 6; R represents methyl; and Y represents an alkylene radical selected from the group consisting of ethylene, 1,2-propylene, and 1,4-butylene.

14. A polyurethane according to claim 1, having a reduced specific viscosity lying in the range from about 0.15 to about 1.4 dl/g, measured in a 1% solution in dimethylformamide at 25° C.

15. A polyurethane according to claim 1, wherein said reduced specific viscosity lies in the range from about 0.2 to about 0.9 dl/g.

16. A molding composition comprising a polyurethane according to claim 1 and a compatible filler.

17. A molding composition according to claim 16, wherein said filler is selected from the group consisting of carbon black, wood flour, powdered glass, calcium carbonate, and thermoplastic resins.

18. An elastomeric body comprising a cross-linked polyurethane according to claim 1.

19. A foamed elastomer body comprising a polyurethane according to claim 1.

* * * * *